United States Patent
Wu et al.

(10) Patent No.: US 9,429,369 B2
(45) Date of Patent: Aug. 30, 2016

(54) THERMAL MODULE STRUCTURE

(75) Inventors: Chun-Ming Wu, New Taipei (TW); Ming-Han Yu, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 884 days.

(21) Appl. No.: 13/226,452

(22) Filed: Sep. 6, 2011

(65) Prior Publication Data

US 2013/0056179 A1    Mar. 7, 2013

(51) Int. Cl.
| | |
|---|---|
| *F28F 7/00* | (2006.01) |
| *F28D 15/00* | (2006.01) |
| *H05K 7/20* | (2006.01) |
| *B21D 39/00* | (2006.01) |
| *B23P 6/00* | (2006.01) |
| *F28D 15/02* | (2006.01) |
| *H01L 23/427* | (2006.01) |

(52) U.S. Cl.
CPC ......... *F28D 15/0275* (2013.01); *H01L 23/427* (2013.01); *H01L 2924/0002* (2013.01)

(58) Field of Classification Search
CPC ....... F28D 15/046; F28D 15/00; F28D 15/04
USPC .......... 165/80.1, 80.2, 80.4, 104.26, 104.33, 165/67, 79, 104.19; 361/697; 29/521, 29/525.13, 890.032
See application file for complete search history.

(56) References Cited

U.S. PATENT DOCUMENTS

| | | | | |
|---|---|---|---|---|
| 5,646,826 | A  * | 7/1997  | Katchmar | 361/704 |
| 5,796,582 | A  * | 8/1998  | Katchmar | 361/704 |
| 6,102,110 | A  * | 8/2000  | Julien et al. | 165/104.33 |
| 6,163,073 | A  * | 12/2000 | Patel | 257/712 |
| 6,937,474 | B2 * | 8/2005  | Lee | 361/715 |
| 7,093,648 | B1 * | 8/2006  | Cheng | 165/104.33 |
| 7,511,958 | B2 * | 3/2009  | Lin | 361/700 |
| 2007/0261787 | A1* | 11/2007 | Malis | 156/285 |
| 2007/0285897 | A1* | 12/2007 | Huang et al. | 361/715 |
| 2008/0314556 | A1* | 12/2008 | Zhou et al. | 165/80.3 |
| 2009/0040725 | A1* | 2/2009  | Peng | H01L 23/4006 361/700 |
| 2011/0120668 | A1* | 5/2011  | Li et al. | 165/67 |

FOREIGN PATENT DOCUMENTS

GB        2293446 A  *  3/1996

* cited by examiner

*Primary Examiner* — M. Alexandra Elve
*Assistant Examiner* — Paul Alvare

(57) ABSTRACT

A thermal module structure includes a base and at least one locating member. The base has at least one channel formed thereon and the channel has a closed bottom portion and an open top portion. At least one first coupling section is formed on the base at a position corresponding to the open top portion of the channel. The locating member is provided on one side with at least one second coupling section corresponding to the first coupling section, and is fitted above the channel with the second coupling section engaged with the first coupling section. Therefore, with the locating member, a heat pipe set in the channel can be quickly and firmly held to the base at upgraded efficiency and reduced time and labor cost.

6 Claims, 16 Drawing Sheets

THERMAL MODULE STRUCTURE

FIELD OF THE INVENTION

The present invention relates to a thermal module structure, and more particularly to a thermal module structure that enables quick and firm holding of heat pipes to a base to largely upgrade the assembling efficiency and save the time and labor cost for forming a thermal module.

BACKGROUND OF THE INVENTION

Following the progress in various technological fields, the currently available electronic elements have constantly improved operational performance and thereby generate more heat during the operation thereof. As a result, consumers' demands for functionally enhanced heat dissipation unit also increase. To provide enhanced heat dissipation effect, most of the conventional heat dissipation units include a radiating fin assembly formed of a plurality of stacked radiating fins. Manufacturers make efforts to research and develop radiating fins, and heat dissipation units with high performance have become one of the most important targets in the nowadays industrial fields. The heat dissipation unit is usually mounted on a top of an electronic element to dissipate heat generated by the electronic element during the operation thereof. Generally, the heat dissipation unit is a heat sink or a radiating fin assembly, which cooperates with a cooling fan to remove heat from a heat source or has one or more heat pipes connected thereto for transferring the heat to a distant location for dissipation.

Taking a computer as an example, the central processing unit (CPU) thereof generates the largest part of heat in a computer case. When the heat generated by the CPU accumulates in the computer case and exceeds an allowable upper limit, the computer tends to crash or even burn out to cause serious damage thereof. Moreover, to solve the problem of electromagnetic radiation, all the important parts and components, including the CPU, of a computer are enclosed in a closed computer case. Therefore, it has become an important issue as how to quickly guide the heat generated by the CPU and other electronic components or elements out of the closed computer case.

The currently available heat dissipating devices and thermal modules are formed by assembling a plurality of heat dissipating elements together. The heat dissipating elements may include heat pipes, heat sinks, heat-dissipating bases, etc. These elements are assembled together mainly by soldering. However, for heat dissipating elements made of an aluminum material, some specific soldering operation is required to inevitably result in high manufacturing cost of the heat dissipating devices.

Some manufacturers also try to assemble different heat dissipating elements together by using fastening elements, such as screws. However, fastening elements like screws can only be used with some types of heat dissipating elements, such as radiating fins and heat-dissipating base. Heat pipes could not be assembled to other heat dissipating elements using screws.

According to the conventional technique, a heat pipe is associated with the heat dissipating base by forming a hole or a channel on the heat dissipating base and extending the heat pipe through the hole or the channel. In this manner, while the heat pipe can be associated with the heat dissipating base without using screws, the heat pipe must still be soldered to the base or tightly fitted in the hole or the channel on the base. By doing this, high material, assembling and manufacturing costs are needed and the heat pipe is easily damaged during the process of soldering or tight fitting to result in low production yield.

In brief, the conventional techniques for assembling different heat dissipating elements together to form a thermal module have the following disadvantages: (1) unable to quickly and firmly hold heat pipes to the heat-dissipating base; (2) requiring high cost for soldering material; (3) having low assembling efficiency to increase time and labor cost; and (4) having low production yield.

SUMMARY OF THE INVENTION

A primary object of the present invention is to provide a thermal module structure that enables quick and firm holding of heat pipes to a base.

Another object of the present invention is to provide a thermal module structure that enables the forming of a thermal module at largely upgraded assembling efficiency and reduced time and labor cost.

To achieve the above and other objects, the thermal module structure according to the present invention includes a base and at least one locating member. The base has at least one channel formed thereon and the channel has a closed bottom portion and an open top portion. At least one first coupling section is formed on the base at a position corresponding to the open top portion of the channel. The locating member is provided on one side with at least one second coupling section corresponding to the first coupling section, and is fitted above the channel with the second coupling section engaged with the first coupling section. Therefore, with the locating member, a heat pipe set in the channel can be quickly and firmly held to the base at upgraded efficiency and reduced time and labor cost.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
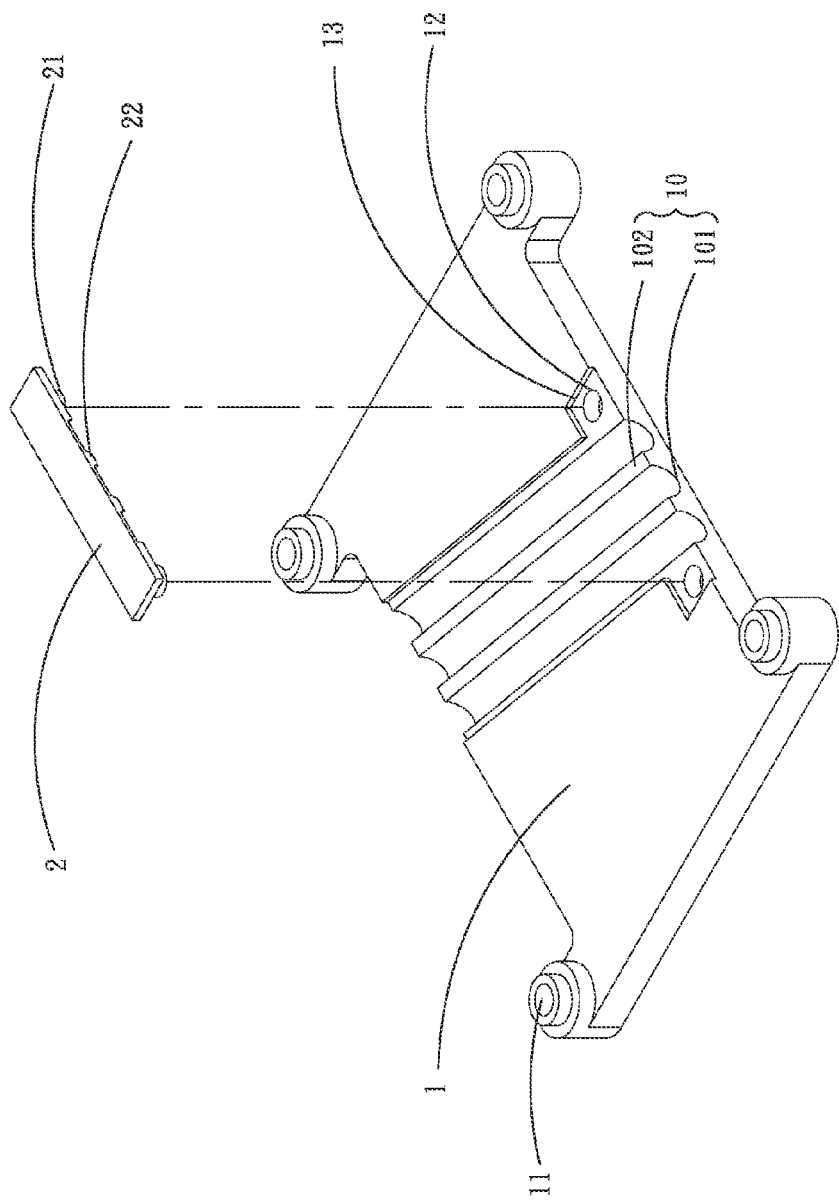
FIG. 1A is an exploded perspective view of a thermal module structure according to a first preferred embodiment of the present invention.

The present invention will now be described with some preferred embodiments thereof and with reference to the accompanying drawings. For the purpose of easy to understand, elements that are the same in the preferred embodiments are denoted by the same reference numerals.

Figure 1B:
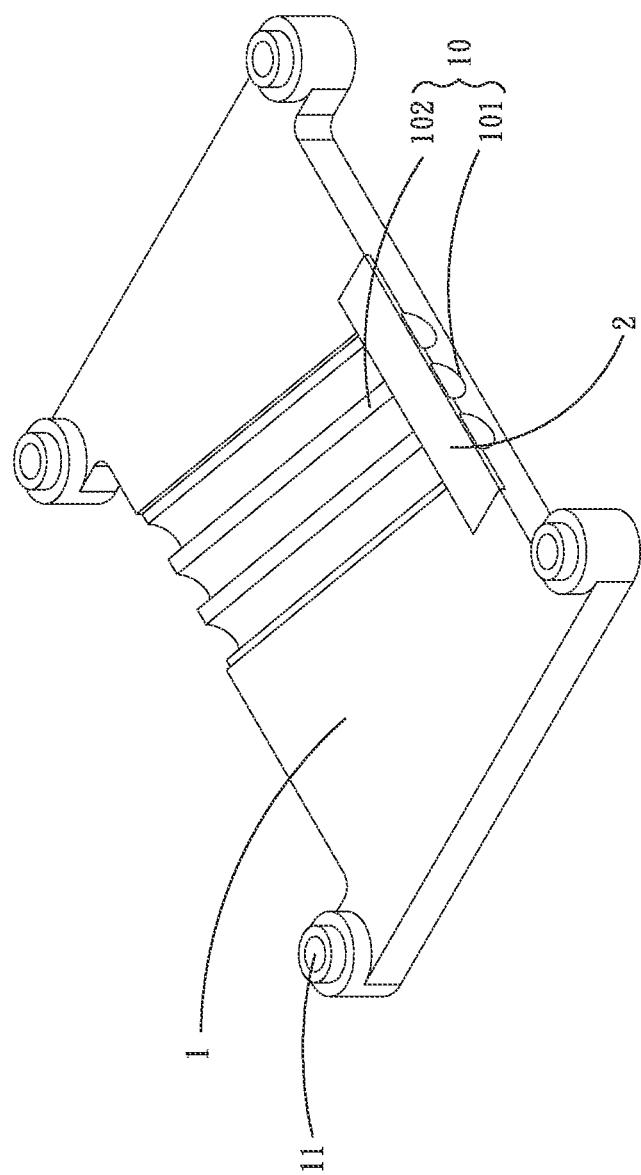
FIG. 1B is an assembled view of FIG. 1A.

Please refer to FIGS. 1A and 1B that are exploded and assembled perspective views, respectively, of a thermal module structure according to a first preferred embodiment of the present invention. As shown, the thermal module structure in the first embodiment includes a base 1 and at least one locating member 2. The base 1 has at least one channel 10 formed on one face thereof and at least one locking section 11 formed on a periphery thereof. In the illustrated first preferred embodiment, there are shown three channels 10 and four locking sections 11. Each of the channels 10 has a closed bottom portion 101 and an open top portion 102. At least one first coupling section 12 is formed on the base 1 at a position corresponding to the open top portions 102 of the channels 10, and a rabbet 13 is formed on the base 1 at a position corresponding to the first coupling section 12. In the illustrated first preferred embodiment, there are shown two first coupling sections 12 and one rabbet 13 provided adjacent to one edge of the base 1. The base 1 can be locked to a heat-generating element via the locking sections 11. The locating member 2 is fitted in the rabbet 13 on the base 1 to thereby correspondingly locate above the channels 10. The locating member 2 has at least one second coupling section 21 and a plurality of pressing sections 22 formed on one side facing toward the base 1. In the illustrated first preferred embodiment, there are shown two second coupling sections 21 corresponding to the first coupling sections 12 and a plurality of pressing sections 22 corresponding to the open top portions 102 of the channels 10. When the locating member 2 is fitted in the rabbet 13, the second coupling sections 21 are correspondingly engaged with the first coupling sections 12 while the pressing sections 22 are correspondingly pressed against the open top portions 102 of the channels 10.

Figure 1C:
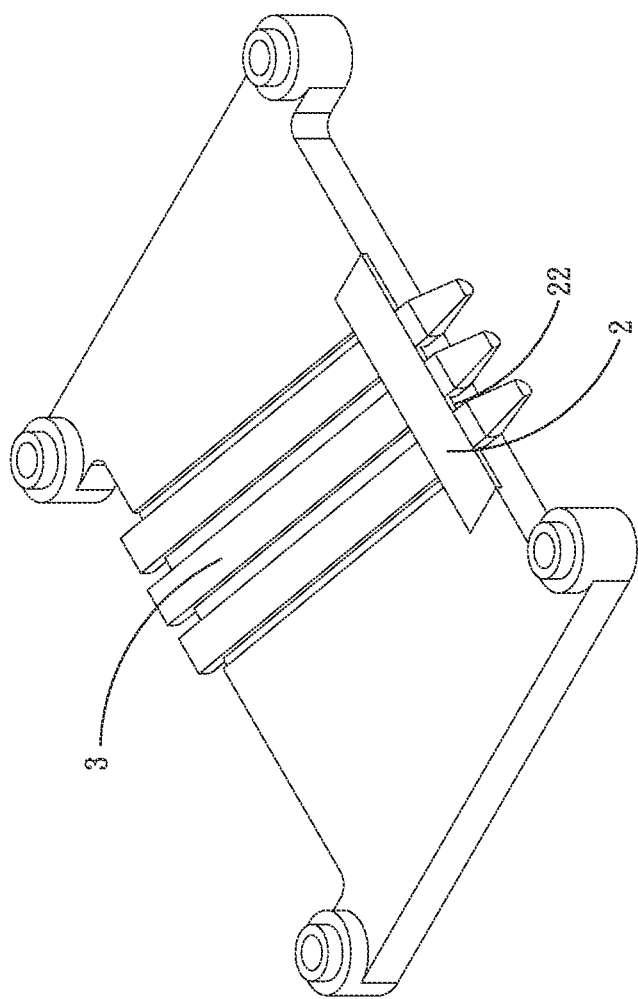
FIG. 1C shows a first example of application of the thermal module structure according to the first embodiment of the present invention.
Figure 1D:
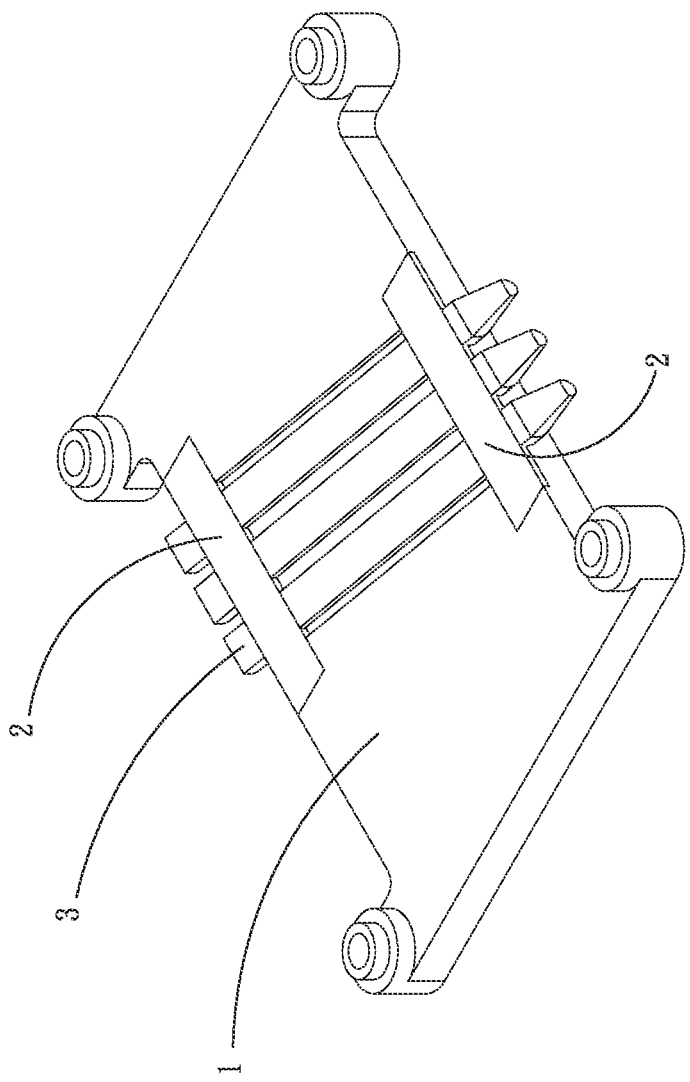
FIG. 1D shows a second example of application of the thermal module structure according to the first embodiment of the present invention.

FIG. 1C shows a first example of application of the thermal module structure according to the first embodiment of the present invention. Please refer to FIGS. 1A and 1C at the same time. As shown, a plurality of heat pipes 3 is assembled to the thermal module structure. The heat pipes 3 are correspondingly set in the channels 10 on the closed bottom portions 101 thereof. After the heat pipes 3 are set in the channels 10, the locating member 2 is fitted in the rabbet 13 with the second coupling sections 21 correspondingly engaged with the first coupling sections 12 and the pressing sections 22 correspondingly pressed against the open top portions 102 of the channels 10, so that the locating member 2 is firmly connected to the base 1 while effectively holding the heat pipes 3 to the channels 10. In this manner, the heat pipes 3 can be efficiently assembled to the thermal module structure at reduced time and labor cost. FIG. 1D shows a second example of application of the thermal module structure according to the first embodiment of the present invention. Please refer to FIGS. 1A and 1D at the same time. As shown, the base 1 can have two rabbets 13 formed adjacent to two opposite edges thereof corresponding to the open top portions 102 of the channels 10, and two locating members 2 can be provided. After the heat pipes 3 are set in the channels 10, the two locating members 2 are separately fitted in the two rabbets 13, so that the locating members 2 are firmly connected to the base 1 while effectively holding the heat pipes 3 to the channels 10, enabling the heat pipes 3 to be efficiently assembled to the thermal module structure at reduced time and labor cost.

Figure 2A:
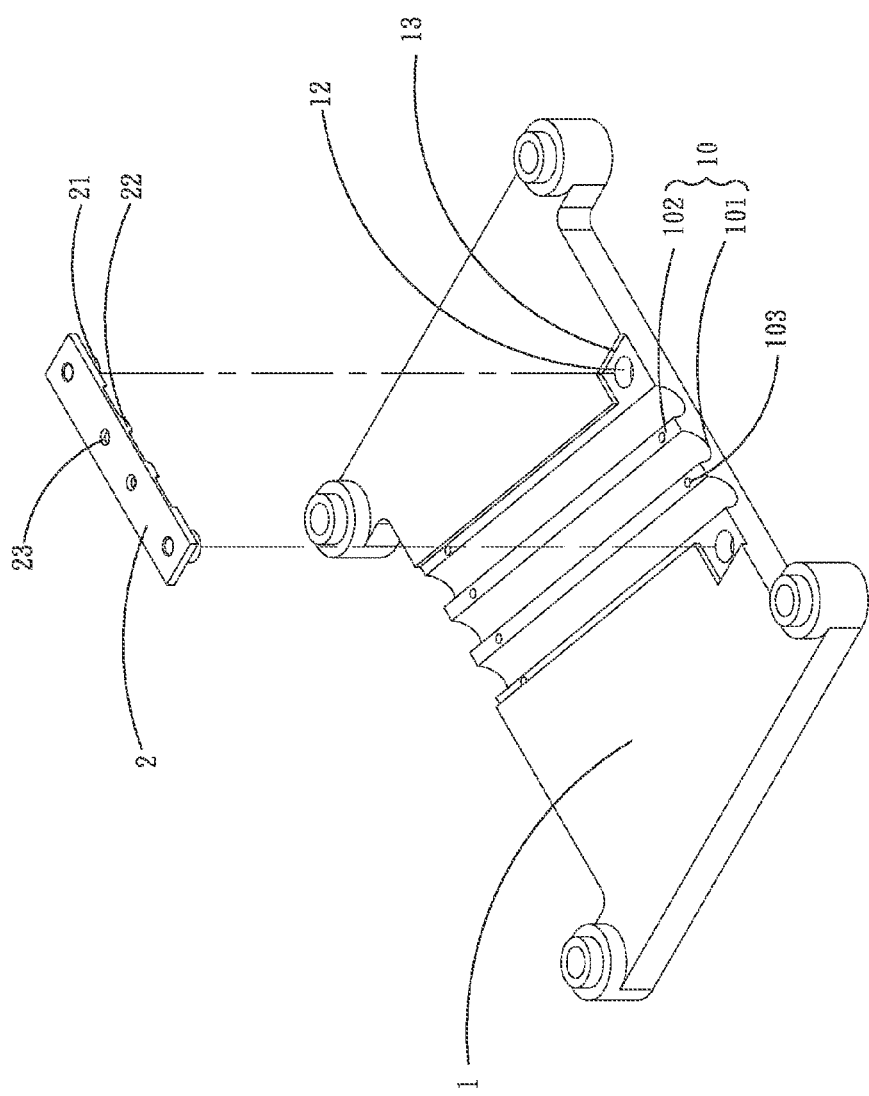
FIG. 2A is an exploded perspective view of a thermal module structure according to a second preferred embodiment of the present invention.
Figure 2B:
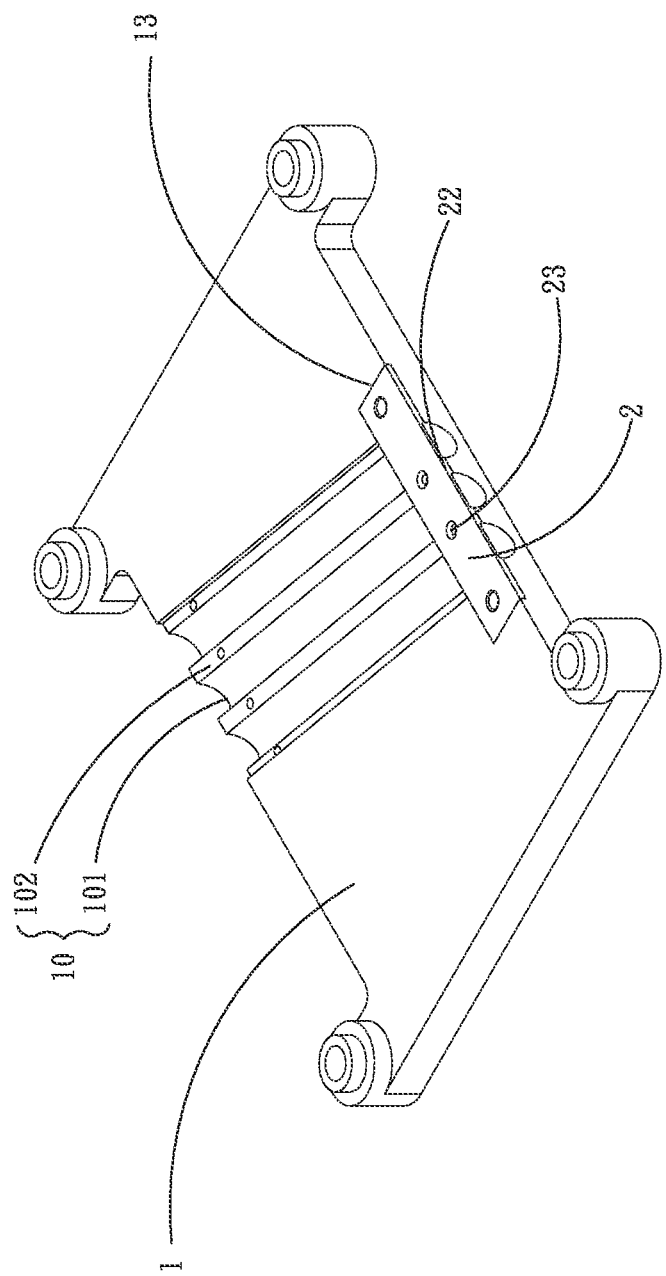
FIG. 2B is an assembled view of FIG. 2A.

Please refer to FIGS. 2A and 2B that are exploded and assembled perspective views, respectively, of a thermal module structure according to a second preferred embodiment of the present invention. As shown, the second embodiment is generally structurally similar to the first embodiment, except that, in the second embodiment, the open top portions 102 are respectively provided with at least one hole 103, which can be a through hole or a blind hole, and the locating member 2 is provided with a plurality of through holes 23, which correspondingly extend through the pressing sections 22 and the second coupling sections 21. When the locating member 2 is fitted in the rabbet 13 on the base 1 to locate above the channels 10, the second coupling sections 21 are correspondingly engaged with the first coupling sections 12, the pressing sections 22 are correspondingly pressed against the open top portions 102 of the channels 10, and the through holes 23 are correspondingly communicable with the holes 103.

Figure 2C:
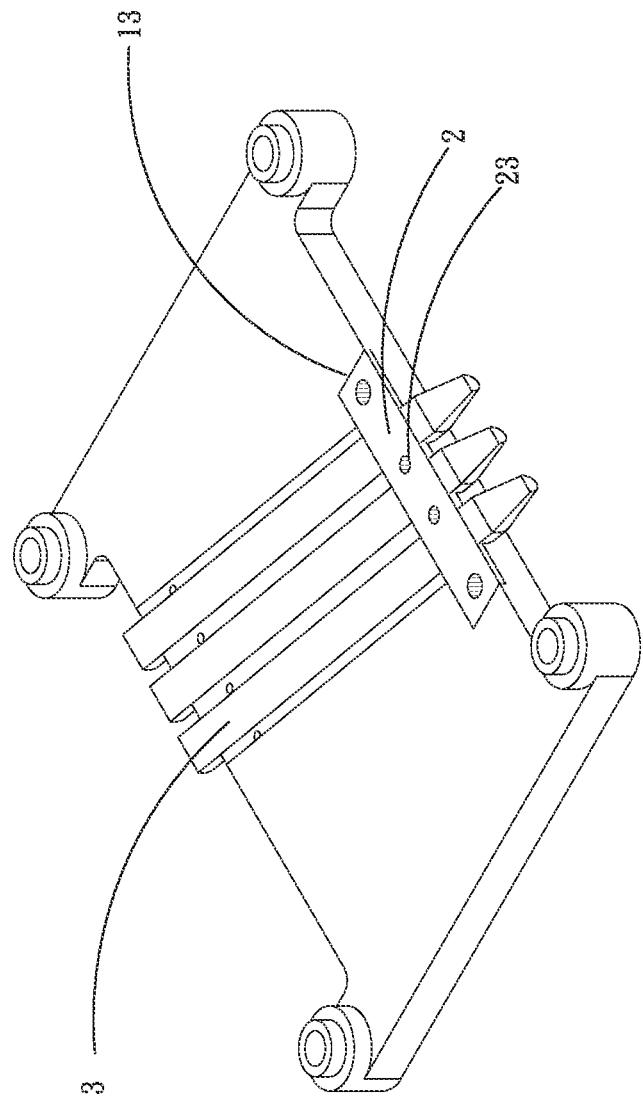
FIG. 2C shows a first example of application of the thermal module structure according to the second embodiment of the present invention.
Figure 2D:
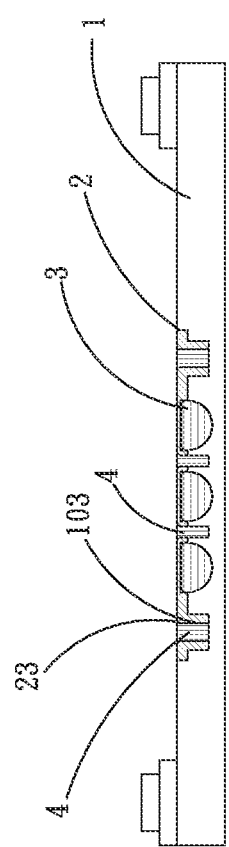
FIG. 2D is a sectional view of FIG. 2C.
Figure 2E:
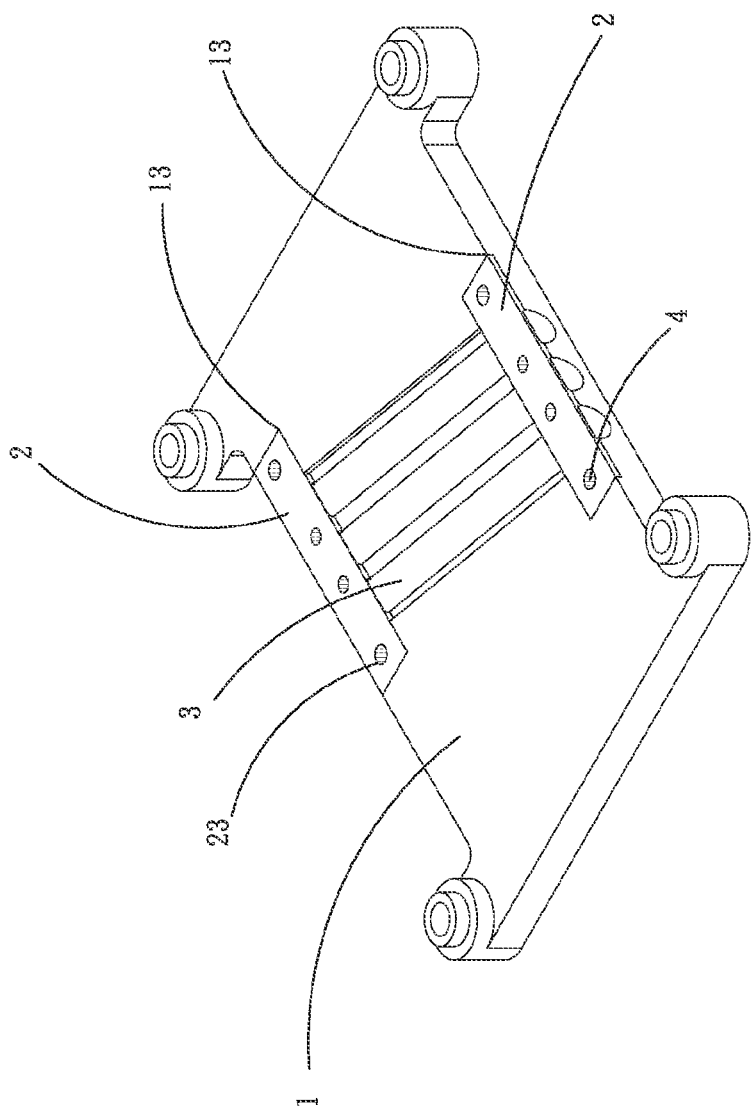
FIG. 2E shows a second example of application of the thermal module structure according to the second embodiment of the present invention.

FIG. 2C shows a first example of application of the thermal module structure according to the second embodiment of the present invention, and FIG. 2D is a sectional view of FIG. 2C. Please refer to FIGS. 2A, 2C and 2D at the same time. As shown, a plurality of heat pipes 3 is assembled to the thermal module structure. The heat pipes 3 are correspondingly set in the channels 10. After the heat pipes 3 are set in the channels 10, the locating member 2 is fitted in the rabbet 13 with the second coupling sections 21 correspondingly engaged with the first coupling sections 12, the pressing sections 22 correspondingly pressed against the open top portions 102 of the channels 10, and the through holes 23 communicating with the holes 103. An adhesive is injected into the through holes 23 and flows to the holes 103, and the adhesive is also injected to between the channels 10 and the heat pipes 3, so that an adhesive layer 4 is formed between the base 1 and the locating member 2 and the heat pipes 3, bringing the locating member 2 to firmly connect to the base 1 while effectively holding the heat pipes 3 to the channels 10. In this manner, the heat pipes 3 can be efficiently assembled to the thermal module structure at reduced time and labor cost. Further, FIG. 2E shows a second example of application of the thermal module structure according to the second embodiment of the present invention. Please refer to FIGS. 2A and 2E at the same time. As shown, the base 1 can have two rabbets 13 formed adjacent to two opposite edges thereof corresponding to the open top portions 102 of the channels 10, and two locating members 2 can be provided. After the heat pipes 3 are set in the channels 10, the two locating members 2 are separately fitted in the two rabbets 13, and an adhesive is injected into the through holes 23 and flows to the holes 103, so that an adhesive layer 4 is formed between the base 1 and the locating members 2, bringing the locating members 2 to firmly connect to the base 1 while effectively holding the heat pipes 3 to the channels 10, and enabling the heat pipes 3 to be efficiently assembled to the thermal module structure at reduced time and labor cost.

Figure 3A:
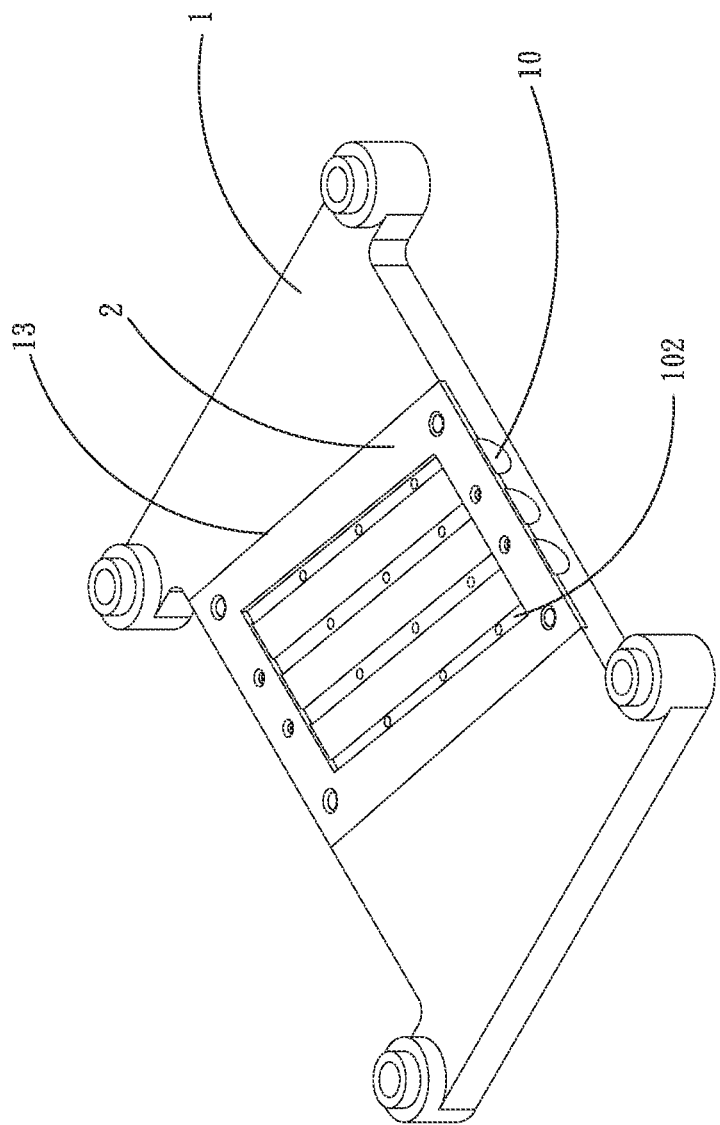
FIG. 3A is an assembled perspective view of a thermal module structure according to a third preferred embodiment of the present invention.
Figure 3B:
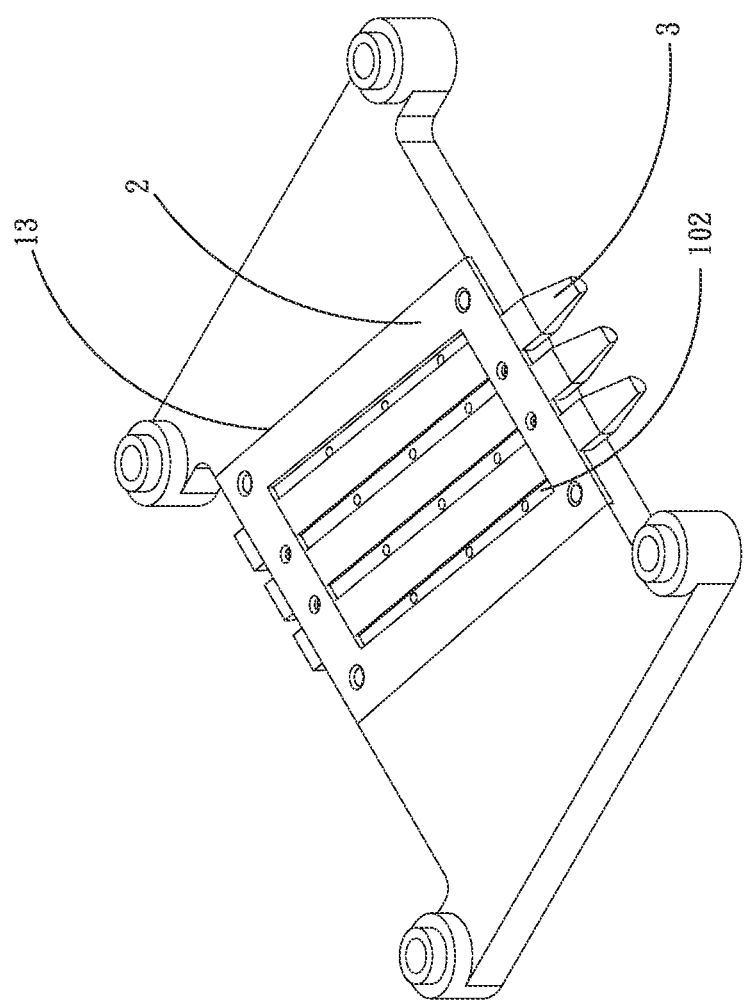
FIG. 3B shows an example of application of the thermal module structure according to the third embodiment of the present invention.

FIG. 3A is an assembled perspective view of a thermal module structure according to a third preferred embodiment of the present invention, and FIG. 3B shows an example of application of the thermal module structure of FIG. 3A. As shown, the third embodiment is generally structurally similar to the first embodiment, except that, in the third embodiment, the rabbet 13 is formed on the base 1 around the open top portions 102 of the channels 10, and the locating member 2 is shaped corresponding to the rabbet 13. Therefore, after the heat pipes 3 are set in the channels 10, the locating member 2 can be effectively fitted in the rabbet 13 to firmly connect to the base 1 while effectively holding the heat pipes 3 to the channels 10. Therefore, the heat pipes 3 can be efficiently assembled to the thermal module structure at reduced time and labor cost.

Figure 4A:
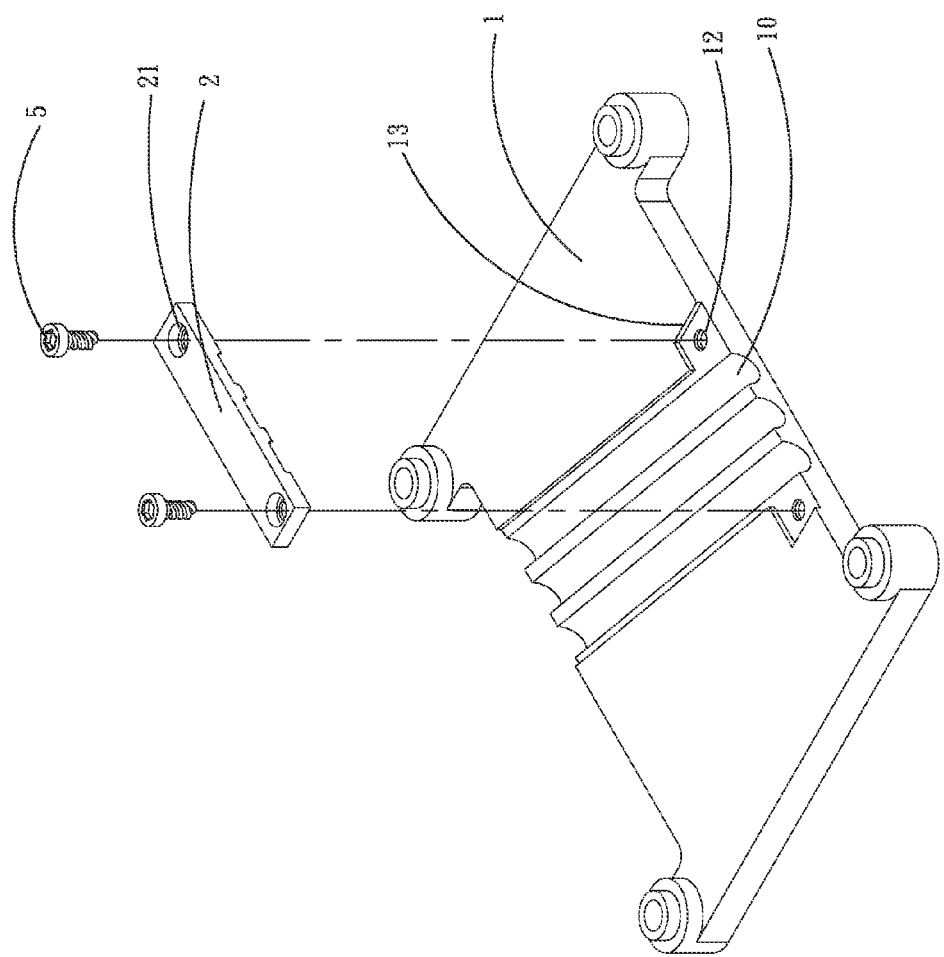
FIG. 4A is an exploded perspective view of a thermal module structure according to a fourth preferred embodiment of the present invention.
Figure 4B:
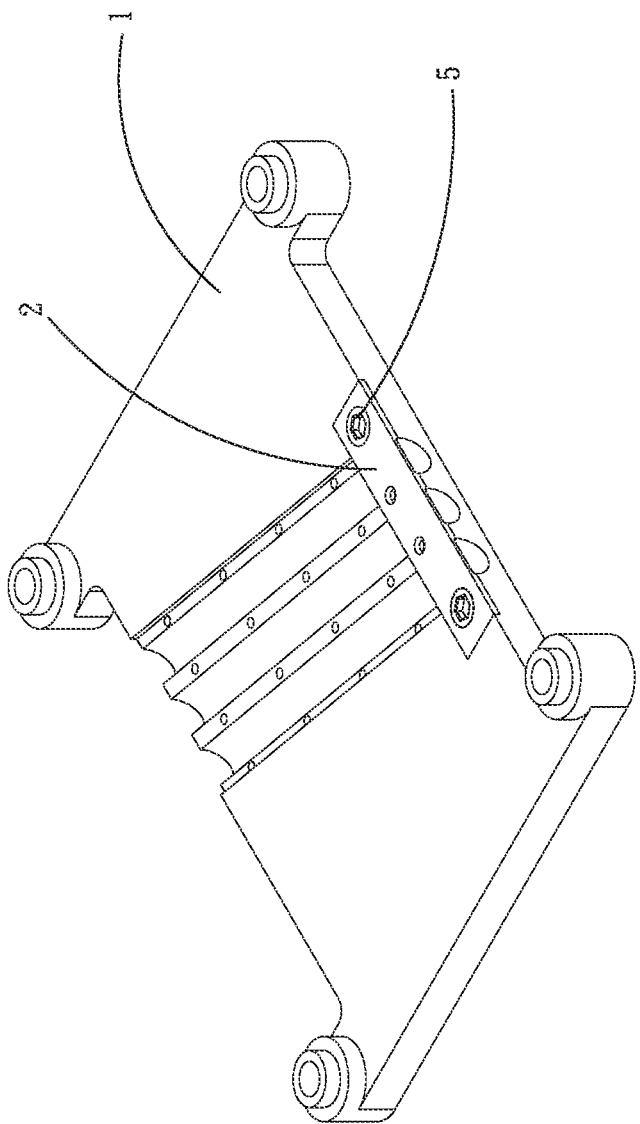
FIG. 4B is an assembled view of FIG. 4A.
Figure 4C:
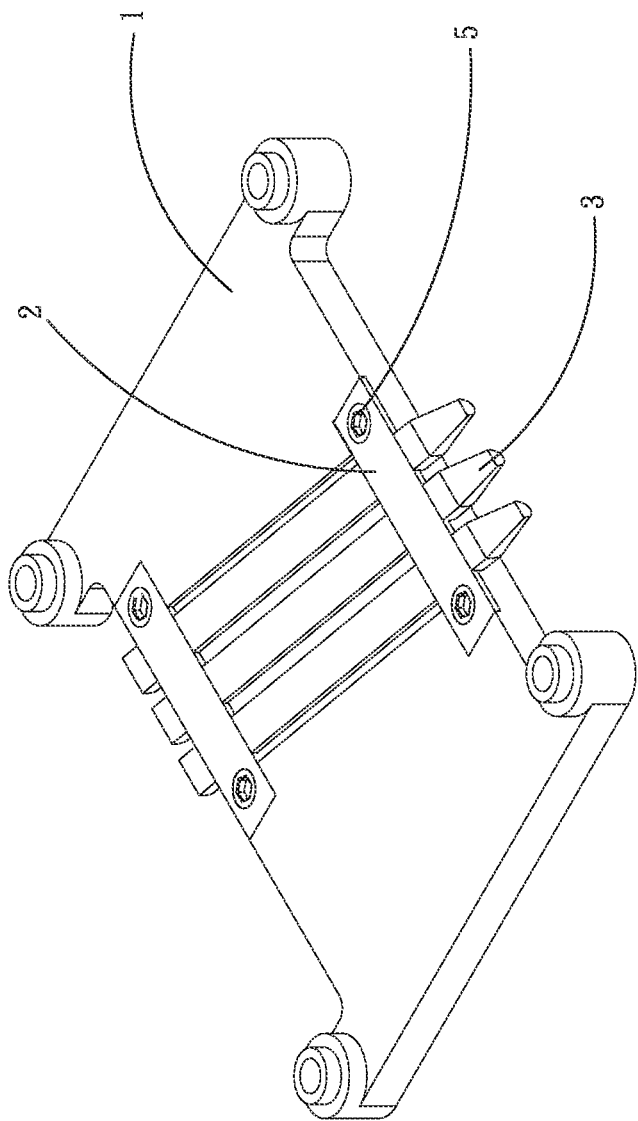
FIG. 4C shows an example of application of the thermal module structure according to the fourth embodiment of the present invention.

Please refer to FIGS. 4A and 4B that are exploded and assembled perspective views, respectively, of a thermal module structure according to a fourth preferred embodiment of the present invention. As shown, the fourth embodiment is generally structurally similar to the first embodiment, except that, in the fourth embodiment, after the locating member 2 is fitted in the rabbet 13 and located above the channels 10, a fastening element 5 is further extended through each set of the engaged first and second coupling sections 12, 21, so that the locating member 2 is firmly connected to the base 1 while effectively holding the heat pipes 3 to the channels 10. In this manner, the heat pipes 3 can be efficiently assembled to the thermal module structure at reduced time and labor cost. Further, FIG. 4C shows an example of application of the thermal module structure according to the fourth embodiment of the present invention. Please refer to FIGS. 4A and 4C at the same time. As shown, the base 1 can have two rabbets 13 formed adjacent to two opposite edges thereof corresponding to the open top portions 102 of the channels 10, and two locating members 2 can be provided. After the heat pipes 3 are set in the channels 10, the two locating members 2 are separately fitted in the two rabbets 13 with the second coupling sections 21 engaged with the first coupling sections 12. And then, fastening elements 5 are sequentially extended through each set of the engaged first and second coupling sections 12, 21, so that the locating members 2 are firmly connected to the base 1 while effectively holding the heat pipes 3 to the channels 10, enabling the heat pipes 3 to be efficiently assembled to the thermal module structure at reduced time and labor cost.

Figure 5A:
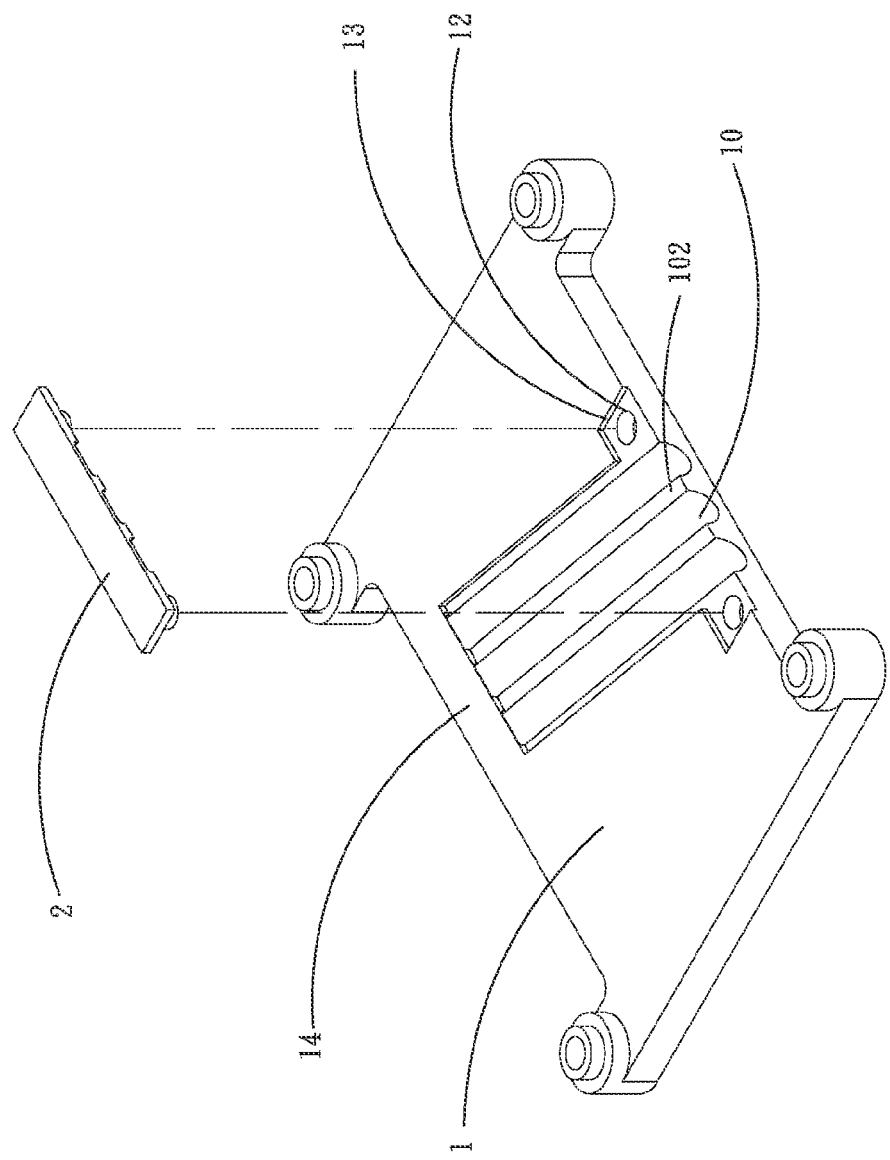
FIG. 5A is an exploded perspective view of a thermal module structure according to a fifth preferred embodiment of the present invention.
Figure 5B:
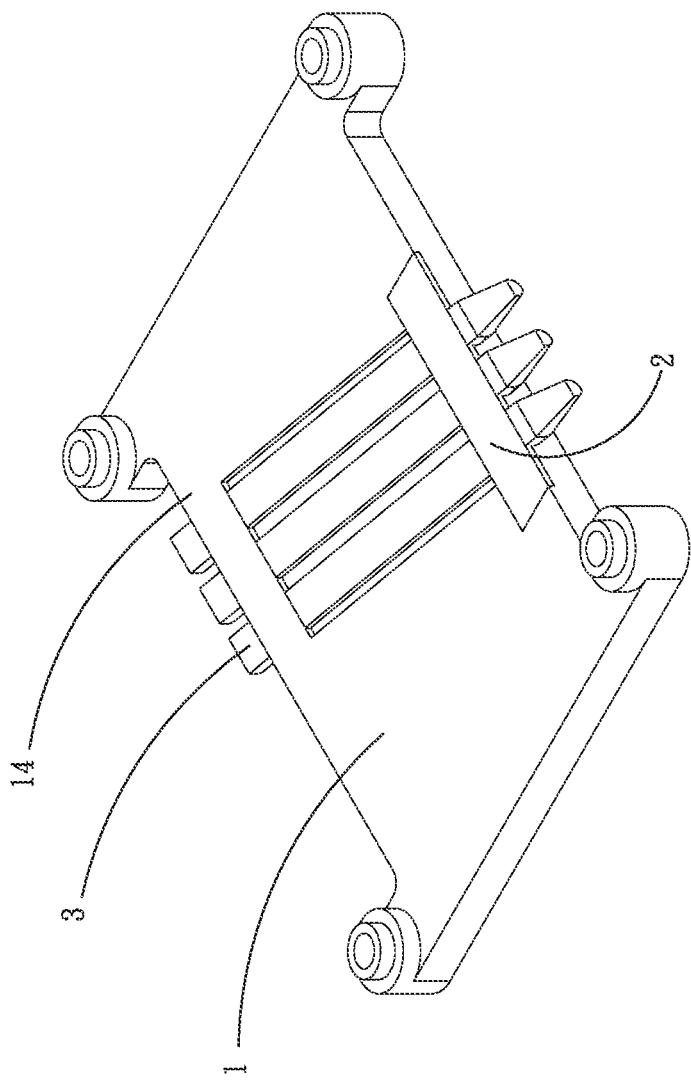
FIG. 5B shows an example of application of the thermal module structure according to the fifth embodiment of the present invention.

FIG. 5A is an exploded perspective view of a thermal module structure according to a fifth preferred embodiment of the present invention, and FIG. 5B shows an example of application of the thermal module structure of FIG. 5A. As shown, the fifth embodiment is generally structurally similar to the first embodiment, except that, in the fifth embodiment, the base 1 is formed adjacent to two opposite edges on one face corresponding to the open top portions 102 of the channels 10 with an integral locating section 14 and two first coupling sections 12, respectively, and a rabbet 13 is formed on the base 1 at a position corresponding to the first coupling sections 12. The locating section 14 integrally formed on the base 1 adjacent to one edge thereof functions to hold down an end of the heat pipes 3 set in the channels 10, and the location member 2, which is movable, can be further fitted in the rabbet 13 to effectively hold the heat pipes 3 to the channels 10. In this manner, the heat pipes 3 can be efficiently assembled to the thermal module structure at reduced time and labor cost.

In conclusion, the thermal module structure according to the present invention provides the following advantages: (1) enabling quick and firm holding of heat pipes to the base of a thermal module; (2) saving the cost of soldering material; (3) enabling upgraded assembling efficiency and reduced time and labor cost; and (4) ensuring high production yield.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A thermal module structure, comprising:
a base being formed on one face with a plurality of channels having a closed bottom portion and an open top portion and at least one coupling hole located at a position corresponding to the open top portion of the channel and located within a rabbet; and
at least one locating member being fitted above the channel and having at least one coupling post corresponding to the at least one coupling hole; and
wherein the base is formed at a position corresponding to the at least one coupling hole with the rabbet located in a front section of the module extending beyond the channels in a lateral direction, but terminating prior to reaching side edges of the module, the channels being recessed in the rabbet,
wherein the at least one coupling post of the locating member is engaged with the at least one coupling hole, such that the at least one locating member is fitted in the rabbet on the base,
wherein a plurality of surfaces exist in between the open top portion of the channels for separating said channels and providing at least one front hole proximate the front section and at least one rear hole opposite the at least one front hole,
wherein the at least one front and rear hole have a diameter smaller that a diameter of the at least one coupling hole, and the locating member is correspondingly provided with at least one through hole that aligns with one of said front holes and one of the at least one coupling holes when assembled,
wherein some through holes on the locating member extend through the coupling posts and communicate with coupling holes, and
wherein an adhesive is provided in the at least one through hole, at least one coupling hole and the at least one front hole to form an adhesive layer and band the structure together.

2. The thermal module structure as claimed in claim 1, wherein the base further has at least one locking section formed on a periphery thereof.

3. The thermal module structure as claimed in claim 1, wherein each channel is used to receive a heat pipe therein.

4. The thermal module structure as claimed in claim 3, wherein the locating member is located above each channel and the heat pipe received therein to thereby hold the heat pipe to the channel.

5. The thermal module structure as claimed in claim 1, wherein the adhesive layer is formed between each channel and a heat pipe received therein.

6. The thermal module structure as claimed in claim 1, wherein the locating member is provided on one side facing toward each channel with at least one pressing section, and the through hole extends through the pressing section.

* * * * *